US010993027B2

(12) United States Patent
Gautama

(10) Patent No.: US 10,993,027 B2
(45) Date of Patent: Apr. 27, 2021

(54) AUDIO SYSTEM CONTROLLER BASED ON OPERATING CONDITION OF AMPLIFIER

(71) Applicant: GOODIX TECHNOLOGY (HK) COMPANY LIMITED, Hong Kong (HK)

(72) Inventor: Temujin Gautama, Boutersem (BE)

(73) Assignee: GOODIX TECHNOLOGY (HK) COMPANY LIMITED, Hong Kong (CN)

( * ) Notice: Subject to any disclaimer, the term of this patent is extended or adjusted under 35 U.S.C. 154(b) by 0 days.

(21) Appl. No.: 15/359,358

(22) Filed: Nov. 22, 2016

(65) Prior Publication Data

US 2017/0150259 A1    May 25, 2017

(30) Foreign Application Priority Data

Nov. 23, 2015    (EP) ..................................... 15195853

(51) Int. Cl.
| | | |
|---|---|---|
| *H03G 11/00* | (2006.01) | |
| *H04R 3/00* | (2006.01) | |
| *H04R 3/04* | (2006.01) | |
| *H03G 7/00* | (2006.01) | |

(52) U.S. Cl.
CPC ............. *H04R 3/007* (2013.01); *H03G 7/002* (2013.01); *H04R 3/04* (2013.01); *H04R 2430/03* (2013.01)

(58) Field of Classification Search
CPC .................................................... H04R 3/007
USPC ......................................................... 381/55
See application file for complete search history.

(56) References Cited

U.S. PATENT DOCUMENTS

| | | | |
|---|---|---|---|
| 5,434,922 A | 7/1995 | Miller | |
| 5,528,695 A | 6/1996 | Klippel | |
| 6,201,873 B1 | 3/2001 | Dal Farra | |
| 6,931,292 B1* | 8/2005 | Brumitt | G10L 21/0208 381/94.3 |
| 8,983,092 B2* | 3/2015 | Thormundsson | H03G 7/007 381/100 |
| 2004/0184627 A1 | 9/2004 | Kost et al. | |

(Continued)

FOREIGN PATENT DOCUMENTS

| | | |
|---|---|---|
| CN | 1305334 A | 7/2001 |
| CN | 201374809 Y | 12/2009 |

(Continued)

OTHER PUBLICATIONS

Extended European Search Report for Patent Appln. No. 15195853.5 (dated Apr. 21, 2016).

(Continued)

*Primary Examiner* — Katherine A Faley
(74) *Attorney, Agent, or Firm* — Scully Scott Murphy & Presser

(57) ABSTRACT

A controller for an audio system. The audio system comprising an audio processor and an amplifier. The controller is configured to: receive an amplifier-operating-condition-signal representative of an operating condition of the amplifier; receive a maximum-threshold-value; and generate control signaling based on the amplifier-operating-condition-signal and the maximum-threshold-value, wherein the control signaling is configured to set an operating parameter of the audio processor.

13 Claims, 3 Drawing Sheets

(56) References Cited

U.S. PATENT DOCUMENTS

| | | | |
|---|---|---|---|
| 2005/0129257 A1* | 6/2005 | Tamura | H04R 17/00 |
| | | | 381/151 |
| 2005/0207584 A1 | 9/2005 | Bright | |
| 2006/0153403 A1* | 7/2006 | Lechner | H03G 9/005 |
| | | | 381/102 |
| 2009/0304190 A1 | 12/2009 | Seefeldt et al. | |
| 2011/0009987 A1 | 1/2011 | Seefeldt et al. | |
| 2012/0106750 A1 | 5/2012 | Thormundsson et al. | |
| 2012/0177226 A1 | 7/2012 | Silverstein et al. | |
| 2012/0243706 A1 | 9/2012 | Sandgren | |
| 2012/0328117 A1* | 12/2012 | Gautama | H03F 1/52 |
| | | | 381/59 |
| 2013/0022208 A1* | 1/2013 | Dhuyvetter | H03G 11/002 |
| | | | 381/55 |
| 2013/0046546 A1 | 2/2013 | Uhle et al. | |
| 2013/0144615 A1 | 2/2013 | Uhle et al. | |
| 2013/0343584 A1 | 12/2013 | Bennett et al. | |
| 2014/0363006 A1 | 12/2014 | Cherigui | |
| 2016/0322949 A1 | 11/2016 | Gautama | |

FOREIGN PATENT DOCUMENTS

| | | |
|---|---|---|
| CN | 201966875 U | 9/2011 |
| CN | 102414746 A | 4/2012 |
| CN | 102414746 B | 8/2013 |
| EP | 1 135 002 A2 | 9/2001 |
| EP | 1251715 A2 | 10/2002 |
| EP | 1542359 A1 | 6/2005 |
| EP | 2 369 852 A1 | 9/2011 |
| WO | 0065872 A1 | 11/2000 |
| WO | WO-01/03466 A2 | 1/2001 |
| WO | 2008057173 A1 | 5/2008 |
| WO | 2011019339 A1 | 2/2011 |
| WO | 2013189938 A1 | 12/2013 |

OTHER PUBLICATIONS

Lee, Kyungsoo et al; "High-Level Power Management of Audio Power Amplifiers for Portable Multimedia Applications"; IEEE/ACM/IFIP Workshop on Embedded Systems for Real Time; pp. 41-46 (2006).

Sturtzer et al, Comparison between voltage and current driving methods of a micro-speaker.

European Search Report, 15166123.8, dated Nov. 4, 2015.

Final Office Action; U.S. Appl. No. 15/141,904; 15 pages (dated Jul. 13, 2018).

Non-Final Office Action; U.S. Appl. No. 15/141,904, 21 pages (dated Nov. 29, 2018).

Final Office Action; U.S. Appl. No. 15/141,904, 23 pages (dated Apr. 5, 2019).

Non-Final Office Action; U.S. Appl. No. 15/141,904; pages (dated Dec. 29, 2017).

* cited by examiner

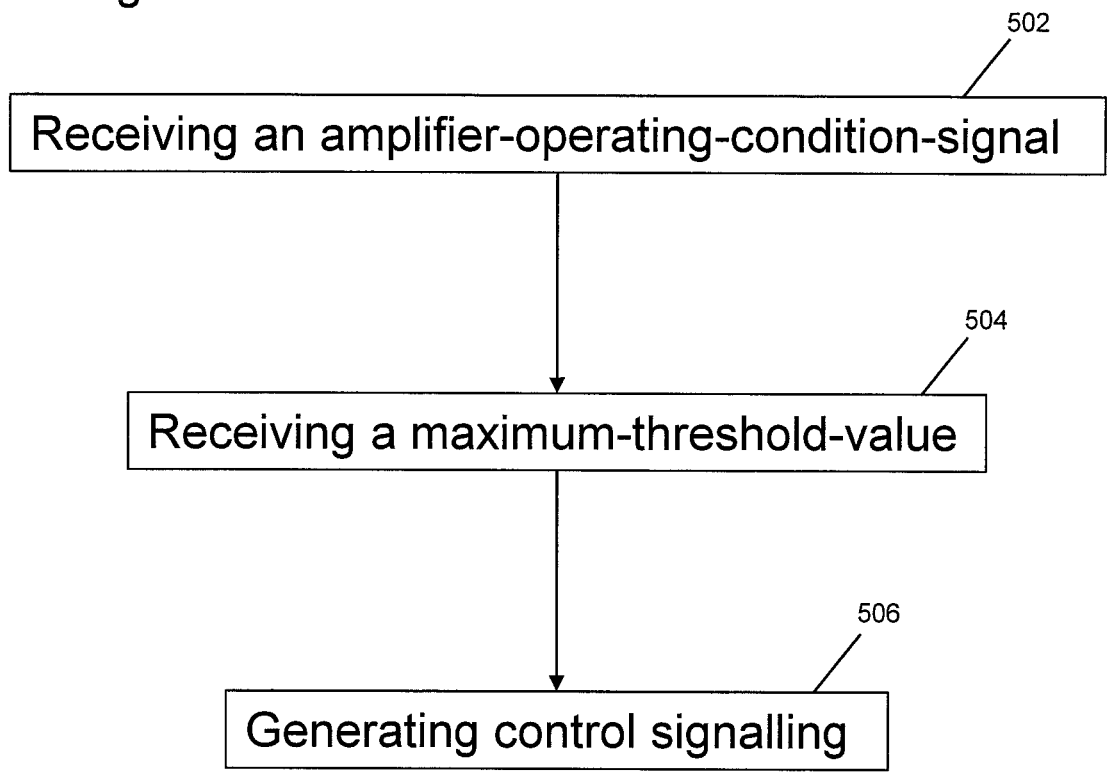

AUDIO SYSTEM CONTROLLER BASED ON OPERATING CONDITION OF AMPLIFIER

CROSS-REFERENCE TO RELATED APPLICATIONS

This application claims the priority under 35 U.S.C. § 119 of European patent application no. 15195853.5, filed Nov. 23, 2015 the contents of which are incorporated by reference herein.

The present disclosure relates to controllers for audio systems, and in particular to controllers that utilise an impedance function of a load of the audio system to control the audio system.

According to a first aspect of the present disclosure there is provided a controller for an audio system, the audio system comprising an audio processor and an amplifier, the controller configured to:

receive an amplifier-operating-condition-signal representative of an operating condition of the amplifier;
    receive a maximum-threshold-value; and
    generate control signalling based on the amplifier-operating-condition-signal and the maximum-threshold-value, wherein the control signalling is configured to set an operating parameter of the audio processor.

Such a controller can reduce the power consumption of the audio system.

In one or more embodiments, the audio system further comprises a load. The controller may be further configured to:

determine or receive a frequency-dependent impedance function of the load; and
    generate the control signalling based on the frequency-dependent impedance function of the load.

In one or more embodiments, the frequency-dependent impedance function of the load defines one or more low-impedance-frequency-bands and one or more high-impedance-frequency-bands. The control signalling may be configured to configure the audio processor to modify audio signals in a low-impedance-frequency-band to a greater extent than audio signals in a high-impedance-frequency-band.

In one or more embodiments, a low-impedance-frequency-band is defined as a frequency band all impedance values of which are less than all those of a low-impedance-frequency-threshold. A high-impedance-frequency-band may be defined as a frequency band all impedance values of which are greater than all those of a high-impedance-frequency-threshold.

In one or more embodiments, the audio processor comprises a high pass filter. The control signalling may be configured to set a cut off frequency of the high pass filter.

In one or more embodiments, the control signalling is configured to increase the cut off frequency of the high pass filter in order to reduce the power consumption of the audio system.

In one or more embodiments, the audio processor comprises one or more shelving filters. The control signalling may be configured to set the corner frequencies and/or the gains of the one or more shelving filters.

In one or more embodiments, the audio processor comprises an analysis and synthesis filterbank. The analysis and synthesis filterbank may be configured to:

split a received digital-audio-input-signal into multiple sub-band signals;
    apply a plurality of gain values to the multiple sub-band signals in order to generate a plurality of processed-sub-band signals, wherein the plurality of gain values are set based on the control signalling;
    combine the processed-sub-band signals in order to provide a digital-audio-output-signal of the analysis and synthesis filterbank.

In one or more embodiments, the audio processor comprises a dynamic range controller. The control signalling may be configured to set one or more of the following operating parameters of the dynamic range controller:

threshold value;
    compression ratio;
    make-up gain; and
    cut-off frequency.

In one or more embodiments, the amplifier-operating-condition-signal is one of the power consumption of the amplifier, the current consumption of the amplifier, or the temperature of the amplifier.

In one or more embodiments, the controller is configured to derive the amplifier-operating-condition-signal from the digital-audio-input-signal.

In one or more embodiments, the load comprises a loudspeaker.

In one or more embodiments, the controller is configured to derive the maximum-threshold-value based on a temperature of the amplifier.

In one or more embodiments, the controller is configured to derive the maximum-threshold-value based on a battery-level of a battery that supplies the audio system.

There may be provided a method of operating an audio system, the audio system comprising an audio processor and an amplifier, the method comprising:

receiving an amplifier-operating-condition-signal representative of an operating condition of the amplifier;
    receiving a maximum-threshold-value; and
    generating control signalling based on the amplifier-operating-condition-signal and the maximum-threshold-value, wherein the control signalling is configured to set an operating parameter of the audio processor.

There may be provided an integrated circuit comprising any controller disclosed herein.

There may be provided an electronic device comprising any controller disclosed herein.

There may be provided a computer program, which when run on a computer, causes the computer to configure any apparatus, including a circuit, controller, system or device disclosed herein or perform any method disclosed herein.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The Figures and Detailed Description that follow also exemplify various example embodiments. Various example embodiments may be more completely understood in consideration of the following Detailed Description in connection with the accompanying Drawings.

BRIEF DESCRIPTION OF DRAWINGS

One or more embodiments will now be described by way of example only with reference to the accompanying drawings in which:

FIG. 5 shows schematically an example embodiment of a method of operating an audio system.

One or more of the examples disclosed herein relate to a controller for an audio system that can use an amplifier-operating-condition-signal and a maximum-threshold-value to set an operating parameter of an audio processor. In some examples, the controller can also use a frequency-dependent impedance function of the amplifier load, which may be a loudspeaker, to set the operating parameter of the audio processor. The controller can advantageously reduce the power consumption of the audio system by controlling the audio processor in this way. Examples that use the frequency-dependent impedance function of the loudspeaker can attenuate audio signals that are at frequencies that correspond to a low impedance of the loudspeaker. In this way, the controller can implement a method to change the audio processing in order to reduce the power consumption of the audio amplifier.

An important property of a mobile device is how long it can operate without recharging the battery. In battery-powered mobile devices with audio capabilities, the audio amplifier can have a considerable impact on the battery life. Systems can switch to a lower-power-consumption mode when the battery power or expected remaining battery life falls below a certain threshold. In such systems, in the audio domain, power can be reduced by applying a full-band attenuation of the audio signal. For example, by deriving a target attenuation factor based on the audio signal level and the current battery power.

Figure 1:
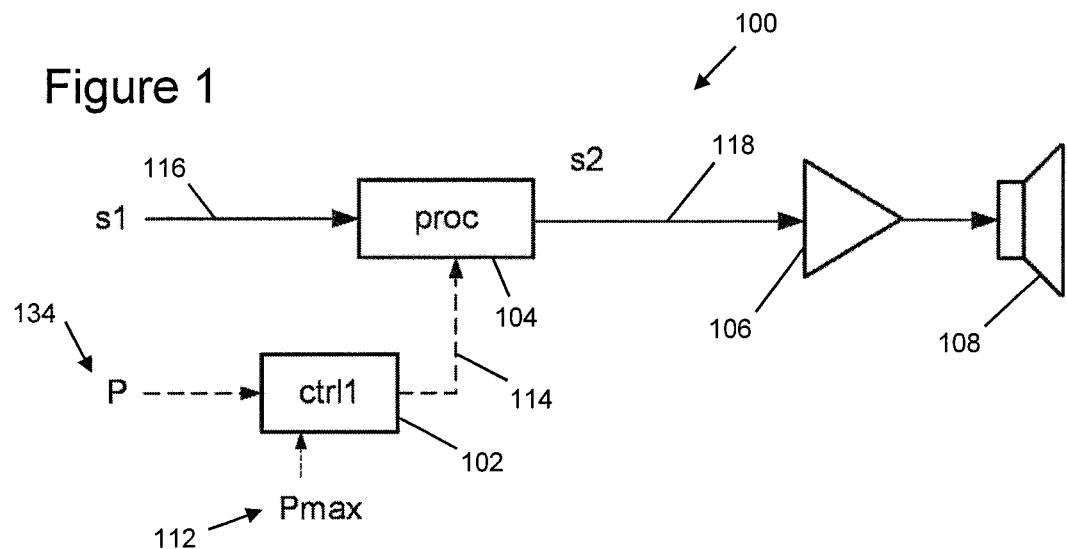
FIG. 1 shows an example embodiment of an audio system.

FIG. 1 shows an example embodiment of an audio system 100. The audio system 100 includes a controller (ctrl1) 102, an audio processor (proc) 104 and a loudspeaker 108. In this example, the audio system 100 also includes an amplifier 106. The audio processor 104 may also be referred to as an audio processing module, and the controller 102 may also be referred to as a control block.

A digital-audio-input-signal (s1) 116 is provided to the audio processing module 104. The output of the audio processing module 104 is a digital-audio-output-signal (s2) 118. The digital-audio-output-signal 118 is provided to an input terminal of the amplifier 106. Optionally, a digital-to-analogue converter (DAC) (not shown) is provided between the audio processor 104 and the input terminal of the amplifier 106. An output terminal of the amplifier 106 provides an amplified-digital-audio-output-signal to the loudspeaker 108.

The audio processing module 104 has operating parameters that define how the audio processing module 104 will process the digital-audio-input-signal 116 in order to provide the digital-audio-output-signal 118. The control block 102 provides control signalling 114 to the audio processing module 104 to set one or more of the operating parameters.

The control block 102 receives Pmax 112, which represents the maximally allowed power or current consumption of the amplifier 106 or for the entire audio system 100. The Pmax 112 value is an example of a maximum-threshold-value that can be processed by the control block 102. The maximum-threshold-value may be representative of a maximum power or a maximum current that should be consumed by the amplifier 106, or the audio system 100 as a whole.

The control block 102 can generate the control signalling 114 based on Pmax 112, such that the operating parameters of the audio processing module 104 can be modified/set on the basis of Pmax 112. This control can be with the objective that the power or current consumption of the amplifier 106 will not exceed the threshold value Pmax 112.

The control block 102 in this example also receives an amplifier-operating-condition-signal 134, which is labelled as 'P' in FIG. 1. The amplifier-operating-condition-signal 134 is representative of an operating condition of the amplifier 106. As non-limiting examples, the operating condition may be the power consumed by the amplifier 106, the current consumed by the amplifier 106, or any other operating condition of the amplifier 106 that enables the power or current consumption to be calculated.

The control block 102 can generate the control signalling 114 based on the amplifier-operating-condition-signal 134, in combination with the Pmax 112 value in this example. In this way, the operating parameters of the audio processing module 104 can be modified on the basis of the amplifier-operating-condition-signal 134. This control can be with the objective that the amplifier-operating-condition-signal 134 or a signal or value that is derived from it will not exceed a threshold value as defined by Pmax 112

The maximum-threshold-value (an example of which is Pmax 112) can be used as a threshold value to which the current or power consumption of the amplifier 106 is limited. The maximum-threshold-value may be supplied by another application or it can be derived from a number of criteria. The maximum-threshold-value may be derived from the remaining battery level in a battery-powered device. In this way, the battery life can be extended.

In other examples, the maximum-threshold-value may be derived from a temperature of the amplifier 106. The power consumption of the amplifier 106 can be related to the heat dissipation of the amplifier 106. Therefore, when the amplifier temperature becomes too high, the maximum-threshold-value can be decreased to prevent thermal damage of the amplifier 106. In this way, the proposed system can implement a thermal protection of the amplifier 106. If the amplifier-operating-condition-signal (an example of which is control signal, P, 134) is the amplifier current, then the maximum-threshold-value may be the maximal current that can be delivered by the amplifier 106. In this way, the proposed system can protect the amplifier against overcurrent.

In some examples the control block 102 of the audio processing module 104 may perform an averaging operation on the amplifier-operating-condition-signal 134, which can represent the power or current consumption of the amplifier 106. The averaging operation may be a temporal smoothing operation, such that the audio processing module 104 can be controlled such that the averaged valued of the power or current consumption of the amplifier 106 will not exceed the threshold value Pmax 112. Therefore, if the value of Pmax 112 is decreased, for example because a battery level drops below a certain level, the operating parameters of the audio processing module 104 can be automatically modified such that the expected amplifier power consumption decreases, thereby extending the battery life.

As indicated above, the amplifier-operating-condition-signal 134 can be representative of a measured value for amplifier current. Alternatively, the control block 102 can derive the amplifier current based on a different amplifier-operating-condition-signal. For example, the amplifier current can be derived from the current that flows into the loudspeaker 108 (load current), and a known value for the efficiency of the amplifier 106. The load current can be measured or it can be estimated from the digital-audio-output-signal (s2) 118 that is sent to the amplifier 106 or from the digital-audio-input-signal (s1) (using a model of the loudspeaker 108/amplifier load). If the amplifier-operating-condition-signal 134 is derived from the digital-audio-input-signal (s1) 116, the operating condition (e.g., power or current consumption) in the absence of the audio processing module 104 is predicted. This enables the control module 102 to estimate how much power reduction should be obtained by the audio processing module 104. Also, it will be appreciated that the power consumption of the amplifier 106 can be derived from the load current and the voltage across the load (loudspeaker 108), or from the load current and a model of the load, or from the voltage across the load and a model of the load.

The embodiment of FIG. 1 can provide an audio processing module that processes a received digital-audio-input-signal (s1) 116 in such a way that the expected power consumption of the audio amplifier 106, which reproduces the audio signal, does not exceed a certain threshold as defined by the target maximal power, Pmax 112.

Figure 2:
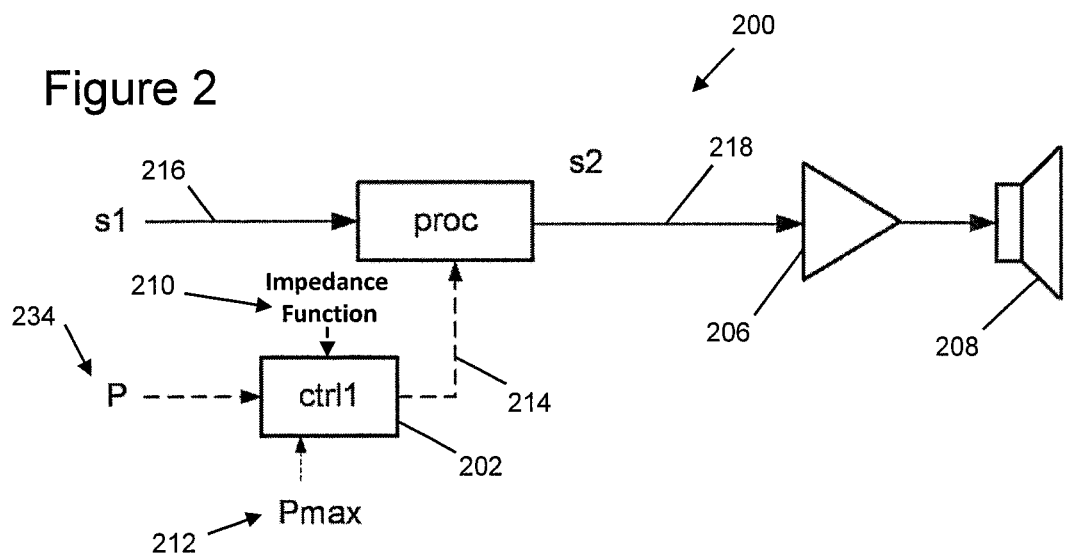
FIG. 2 shows another example embodiment of an audio system.

In some examples, including those of FIGS. 1 and 2, the audio processing module can comprise a (possibly multi-band) dynamic range controller (DRC), a filtering operation, or a frequency-domain processing module. The audio processing module can optionally be bypassed when there is no need for power reduction, for example when the remaining battery power exceeds a certain safe level.

In examples where the audio processing module is a (possibly multi-band) DRC, the operating parameters of the DRC can be changeable by the control block as a function of target maximal power, Pmax. In one example, the control block can generate the control signalling such that it sets a threshold value of the DRC in accordance with the target maximal power Pmax. When the threshold value of the DRC is decreased, the expected signal power for high-amplitude audio signals reduces, while low-amplitude signals may not be significantly affected. This can be an advantage when compared to a system that applies a straightforward attenuation factor (based on remaining battery power) to an entire audio signal, which would attenuate all signal levels equally. Furthermore, it can take into account the amplifier-operating-condition-signal, such that the operating parameters modification takes into account the expected power consumption (which may be derived from or dependent on the digital-audio-input), as opposed to applying a fixed processing for power reduction.

In other examples where the audio processing module comprises a DRC, the control signalling can set one or more of the following operating parameters of the DRC: compression ratio; make-up gain; and cut-off frequency. This can be in addition to, or instead of, setting a threshold value of the DRC, as discussed above.

In the example of FIG. 1 where the audio processing module 104 is a (multi-band) DRC, and where the control block 102 receives a control signal, P 134, this implementation can be considered as similar to a side-chain dynamic range controller (SCDRC). The side-chain signal can be the expected amplifier current. The side-chain signal can also be the amplifier power consumption. The threshold value for the power signal (Pmax 112) may be related to the target maximal power. If the side-chain signal consists of the current signal, a current limiting can be implemented. If the side-chain signal consists of the predicted power signal, a power limitation can be implemented.

The power consumption of the audio amplifier 106 is related to the voltage across, and the current flowing into, the load of the amplifier 108. In this example, the load of the amplifier 106 is the loudspeaker 108. Therefore, controlling the audio processing module 104 based on the frequency-dependent impedance function 110 of the loudspeaker 108 can further reduce the power consumption of the audio system 100, as will be discussed in further detail below.

The example of FIG. 1 illustrates a single amplifier and loudspeaker, although it will be appreciated that other examples can relate to multi-channel systems. It will further be appreciated that the loudspeaker 108 is one example of a load of an audio system, and that examples disclosed herein can be equally effective with different loads.

FIG. 2 shows an example embodiment of another audio system 200. Features of FIG. 2 that have already been described with reference to FIG. 1 will not necessarily be described again here.

In this example, the control block 202 also receives a frequency-dependent impedance function 210 of the loudspeaker 208. The control block 202 generates the control signalling 214 based on the frequency-dependent impedance function 210 of the loudspeaker 208, such that the control signalling 214 can be used to set an operating parameter of the audio processing module 204.

In this example, the control block 202 may determine the frequency-dependent impedance function itself. Alternatively, the frequency-dependent impedance function can be provided by another application or retrieved from memory. For instance, it may be retrieved from a database stored in memory, using an identifier of the loudspeaker 208. In yet another example, the control block 202 could determine the load impedance using measured values for (i) the voltage across the loudspeaker 208; and (ii) the current flowing into the loudspeaker 208. A yet further alternative is to use a microphone recording of an acoustical output of the loudspeaker 208. In these cases, a loudspeaker model can be adapted over time. Also, the control block 202 could determine a loudspeaker model in a calibration mode of operation, and then assume that the model does not change afterwards.

In summary, the embodiment of FIG. 2 can use audio processing to limit the power consumption of the audio amplifier 206, therefore extending the battery life time of any mobile device that may be associated with the audio system 200. The approach of FIG. 2 can be considered advantageous over systems that reduce power consumption by attenuating an audio signal without taking into account that power dissipation of the load may not be uniform across the audio frequency spectrum. Furthermore, the expected power consumption for the digital-audio-input-signal may be taken into account to determine how much power reduction should be achieved by the audio processing module.

Figure 3:
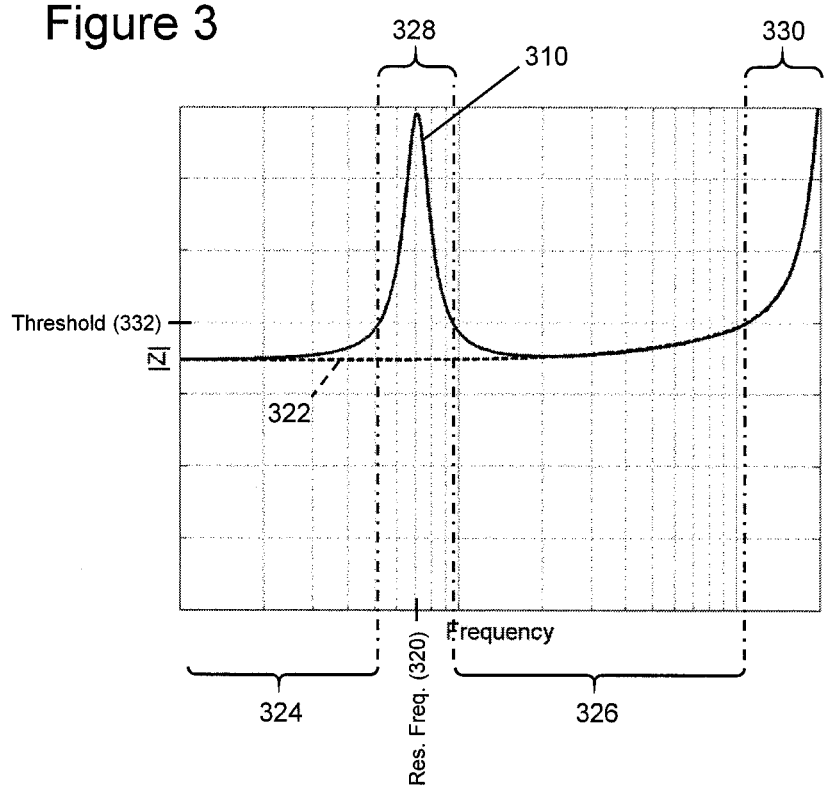
FIG. 3 shows an example of a frequency-dependent impedance function of a loudspeaker.

FIG. 3 shows an example of a frequency-dependent (electrical) impedance function 310 of a loudspeaker. It can be seen that the impedance function has a resonant frequency 320, at which point the electrical impedance function is high.

The impedance magnitude includes a purely resistive component, Re, and an inductive component, Le (the contribution of Re and Le is represented by the dashed curve 322). This means that, for a typical loudspeaker, the current in the frequency region around its resonant frequency 320, and also the current at higher frequencies (where the impedance of the inductive component Le is high), are small compared to that at other frequencies (where the electrical impedance function is smaller). The power consumption of the audio amplifier is lower in the frequency regions of the frequency-dependent impedance function 310 that have a higher impedance.

In this way, the frequency-dependent impedance function 310 of the loudspeaker defines one or more low-impedance-frequency-bands 324, 326 and one or more high-impedance-frequency-bands 328, 330. A low-impedance-frequency-band may be defined as a frequency band that has an impedance that is less than a low-impedance-frequency-threshold. Similarly, a high-impedance-frequency-band may be defined as a frequency band that has an impedance that is greater than a high-impedance-frequency-threshold. An example impedance-threshold 332, which corresponds to both the low-impedance-frequency-threshold and the high-impedance-frequency-threshold, is shown in FIG. 3.

Alternatively, a low-impedance-frequency-band may be defined as a frequency band all impedance values of which are less than all those of a high-impedance-frequency-band, and vice versa.

In FIG. 3, the frequency-dependent impedance function 310 includes:
- a first-high-impedance-frequency-band 328, which is shown as a frequency band/range that encompasses the resonant frequency 320. In some examples, the limits of the first-high-impedance-frequency-band 328 may be defined by (i) the resonant frequency 320 plus a predetermined-frequency-value; and (ii) the resonant frequency 320 minus a predetermined-frequency-value;
- a first-low-impedance-frequency-band 324, which is shown as a frequency band that is less than the resonant frequency 320, in this example less than the first-high-impedance-frequency-band 328;
- a second-low-impedance-frequency-band 326, which is shown as a frequency band that is greater than the resonant frequency 320, in this example greater than the first-high-impedance-frequency-band 328; and
- a second-high-impedance-frequency-band 330, which is shown as a frequency band that is greater than the resonant frequency 320. The lower limit of the second-high-impedance-frequency-band 328 may be defined by the frequency value at which the frequency-dependent impedance function 310 exceeds the impedance-threshold 332.

As will be discussed in more detail below, the control signalling provided by the control block of FIG. 1 can cause the audio processing module to attenuate audio signals in a low-impedance-frequency-band 324, 326 to a greater extent than audio signals in a high-impedance-frequency-band 328, 330. This functionality can be implemented using one or more filters, as non-limiting examples. In this way, power consumption can be lowered in a way that has a lesser negative effect on audio volume and/or audio quality than is the case for systems that simply attenuate an audio signal uniformly across the entire frequency spectrum.

Figure 4:
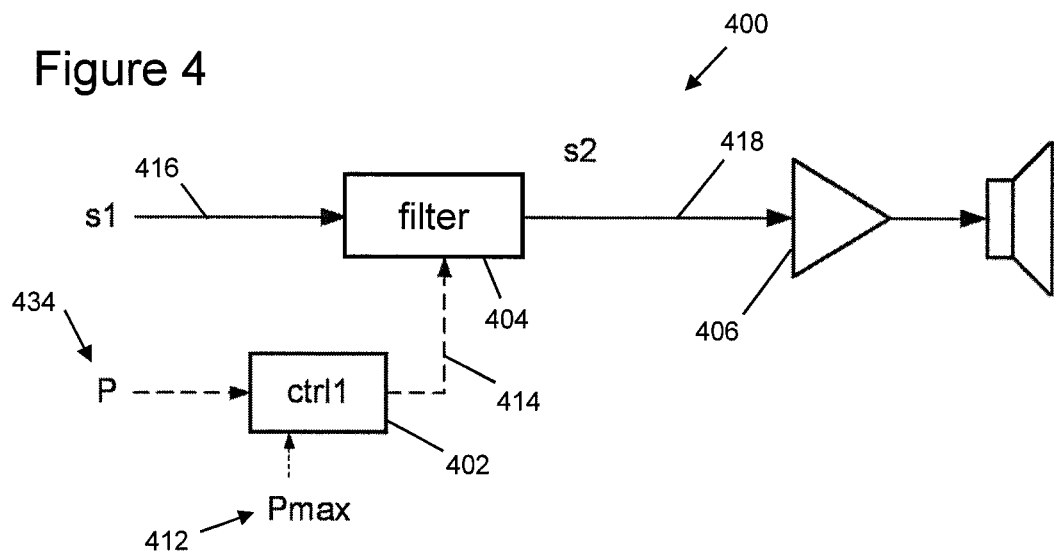
FIG. 4 shows a further example embodiment of an audio system.

FIG. 4 shows another example embodiment of an audio system 400. Features of FIG. 4 that have already been described with reference to FIG. 1 or FIG. 2 will not necessarily be described again here. The control block 402 of FIG. 4 does not necessarily process a frequency-dependent impedance function of the loudspeaker 408 when generating the control signalling 414.

In this example, the audio processing module is a filter 404. In this way, frequency-selective parts of the digital-audio-input-signal (s1) 416 can be attenuated to limit the expected power consumption of the amplifier 406. In this example, the filter 404 is a high-pass filter, the cut-off frequency of which can be set based on the control signalling 414 provided by the control block 402. The cut-off frequency can be increased in order to lower the power consumption. As will be appreciated from the frequency-dependent impedance function of FIG. 3, and assuming that the cut-off frequency is located in the first-low-impedance-frequency-band, increasing the cut-off frequency will reduce the amount of low-impedance-frequencies that will be processed by the amplifier 406, and will therefore reduce the amount of power consumed by the amplifier 406. In this way, the high-pass filter 404 can be used to pass the first- and second-high-impedance-frequency-band of the frequency-dependent impedance function, which has been recognised as consuming lower power than low-impedance-frequency-bands.

Additionally or alternatively, the audio processing module may comprise one or more shelving filters. As will be appreciated from the discussion of FIG. 32, one or more shelving filters can be used to pass some or all of a first-high-impedance-frequency-band that includes a resonant frequency. The control signalling 414 can then set the gains and/or corner frequencies of the shelving filters based on the frequency-dependent impedance function of the loudspeaker. In this way, the control block 402 can control the proportion of the digital-audio-output-signal (s2) 418 that consists of a low-impedance-frequency-band of the frequency-dependent impedance function, and therefore control the power consumed by the amplifier 406. This can be an advantageous way of lowering power consumption in a way that has a disproportionately reduced negative effect on audio volume and/or audio quality.

Additionally or alternatively, the audio processing module 404 may comprise an analysis and synthesis filterbank. The analysis filterbank splits the digital-audio-input-signal 416 into multiple sub-band signals. The sub-band signals may be internal to the audio processing module. The audio processing module can then apply a plurality of gain values to the multiple sub-band signals in order to generate a plurality of processed-sub-band signals, wherein the plurality of gain values are set based on the control signalling 414. The levels of the processed-sub-band signals can therefore be based on the frequency-dependent impedance function of the loudspeaker. The synthesis filterbank can then combine the processed-sub-band signals in order to obtain the digital-audio-output-signal (s2) 418. In this way, the control block 402 can control the proportion of the digital-audio-output-signal (s2) 418 that consists of a low-impedance-frequency-band of the frequency-dependent impedance function, and therefore control the power consumed by the amplifier 406.

The filtering operation that is performed by the filter 404 can take into account the impedance function such that frequencies where the impedance function is high are less attenuated than other frequency regions. The control signal, P, 434 can be computed in the same manner as in the embodiment of FIG. 2, and can be fed into the control block 402 such that the control signalling 414 adapts the cut-off frequency and/or gains of the filter 404. Therefore, on average, the expected power consumed by the amplifier 406 can remain below the target maximal power Pmax 412. This can be achieved, for example, by increasing the cut-off frequency of a high-pass filter if the predicted power (as represented by the control signal, P, 434) exceeds the target maximal power Pmax 412. In some examples, if the predicted power is less than the target maximal power Pmax 412, the control block 402 can decrease the cut-off frequency in order for the amplifier 406 to consume more power.

FIG. 5 illustrates schematically a method of operating an audio system, the audio system comprising an audio processor and an amplifier.

At step 502, the method includes receiving an amplifier-operating-condition-signal representative of an operating condition of the amplifier. The amplifier-operating-condition-signal may be representative of a measured or estimated value for the operating condition. At step 504, the method involves receiving a maximum-threshold-value. As discussed above, in some examples the maximum-threshold-value is representative of a charge level of a battery that supplies the audio system.

At step 506, the method includes generating control signalling based on the amplifier-operating-condition-signal and the maximum-threshold-value. The control signalling can set an operating parameter of the audio processor.

In some examples, the method also includes, before step 506, determining or receiving a frequency-dependent impedance function of a load. Then, the step of generating control signalling at step 506 can also be based on the frequency-dependent impedance function of the load.

Examples disclosed herein can include one or more of the following components:
- an amplifier;
- an audio processing module;
- a control block to set the operating parameters of the audio processing module based on a value (target maximal power or target maximal current, or other); and
- a loudspeaker, which may include multiple loudspeakers optionally with a cross-over filter.

There is also provided an audio system for a mobile device comprising:
- an audio processor;
- a controller, the controller being coupled to the audio processor, and configured to derive or receive a control signal related to a power consumption of an amplifier;
- wherein the controller is operable to modify the operating parameters of the audio processor dependent on a comparison between the control signal and a threshold value.

One or more of the embodiments disclosed herein can be used in battery-powered devices with audio capabilities (such as smartphones, laptops), to modify the audio output when the battery is running low. They can also be used to set the device in a 'battery-friendly' audio mode. Further still, they can also be used for thermal management and/or over-current protection of an amplifier.

The instructions and/or flowchart steps in the above Figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/ method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A controller for an audio system, the audio system comprising an audio processor and an amplifier, the controller configured to: receive an amplifier-operating-condition-signal representative of an operating condition of the amplifier; receive a maximum-threshold-value, wherein the maximum-threshold-value is representative of a charge-level of a battery that supplies the audio system; and generate control signaling based on the amplifier-operating-condition-signal and the maximum-threshold-value, wherein the control signaling is configured to set an operating parameter of the audio processor, wherein the audio system further comprises a load, and wherein the controller is further configured to: determine or receive a frequency-dependent impedance function of the load; and generate the control signaling based on the frequency-dependent impedance function of the load, wherein the frequency-dependent impedance function of the load defines one or more low-impedance-frequency-bands and one or more high-impedance-frequency-bands, wherein a low-impedance-frequency-band is defined as a frequency band all impedance values of which are lower than a low-impedance threshold, a high-impedance-frequency-band is defined as a frequency band all impedance values of which are greater than a high-impedance threshold, and wherein the control signaling is configured to configure the audio processor to attenuate audio signals in a low-impedance-frequency-band to a greater extent than audio signals in a high-impedance-frequency-band.

2. The controller of claim 1, wherein the audio processor comprises one or more shelving filters, and wherein the control signaling is configured to set corner frequencies and/or gains of the one or more shelving filters.

3. The controller of claim 1, wherein the audio processor comprises an analysis and synthesis filterbank, the analysis and synthesis filterbank configured to:
   split a received digital-audio-input-signal into multiple sub-band signals;
   apply a plurality of gain values to the multiple sub-band signals in order to generate a plurality of processed-sub-band signals, wherein the plurality of gain values are set based on the control signaling;
   combine the processed-sub-band signals in order to provide a digital-audio-output-signal of the analysis and synthesis filterbank.

4. The controller of claim 1, wherein the control signaling is further configured to set one or more of the following operating parameters of a dynamic range controller:
   compression ratio;
   make-up gain; and
   cut-off frequency.

5. The controller of claim 1, wherein the amplifier-operating-condition-signal is one of a power consumption of the amplifier, a current consumption of the amplifier, or a temperature of the amplifier.

6. The controller of claim 1, wherein the controller is configured to derive the amplifier-operating-condition-signal from a digital-audio-input-signal.

7. The controller of claim 1, wherein the load comprises a loudspeaker.

8. The controller of claim 1, wherein the controller is configured to derive the maximum-threshold-value based on a temperature of the amplifier.

9. The controller of claim 1, wherein the controller is configured to derive the maximum-threshold-value based on the charge-level of the battery that supplies the audio system.

10. The controller of claim 1, wherein the amplifier-operating-condition-signal is representative of an amplifier current, and wherein the maximum-threshold-value is a maximal current delivered by the amplifier.

11. The controller of claim 1, wherein the controller is further configured to perform an averaging operation on the amplifier-operating-condition-signal that represents a power consumption of the amplifier, and wherein the averaging operation comprises a temporal smoothing operation such that when the maximum-threshold-value is decreased, the audio processor is automatically modified to decrease an expected amplifier power consumption in order to extend a battery life of the battery.

12. An audio system comprising: an audio processor; an amplifier; a load, wherein a frequency-dependent impedance function of the load defines one or more low-impedance-frequency-bands and one or more high-impedance-frequency-bands; and a controller, the controller configured to: receive an amplifier-operating-condition-signal representative of an operating condition of the amplifier; receive a maximum-threshold-value, wherein the maximum-threshold-value is representative of a charge-level of a battery that supplies the audio system; and generate control signaling based on the amplifier-operating-condition-signal and the maximum-threshold-value, wherein the control signaling is configured to set an operating parameter of the audio processor, a load, wherein the controller is further configured to: determine or receive a frequency-dependent impedance function of the load; and generate the control signaling based on the frequency-dependent impedance function of the load, wherein the frequency-dependent impedance function of the load defines one or more low-impedance-frequency-bands and one or more high-impedance-frequency-bands, wherein a low-impedance-frequency-band is defined as a frequency band all impedance values of which are lower than a low-impedance threshold, a high-impedance-frequency-band is defined as a frequency band all impedance values of which are greater than a high-impedance threshold, and wherein the control signaling is configured to configure the audio processor to attenuate audio signals in a low-impedance-frequency-band to a greater extent than audio signals in a high-impedance-frequency-band.

13. The audio system of claim 12, wherein the controller is further configured to perform an averaging operation on the amplifier-operating-condition-signal that represents a power consumption of the amplifier, and wherein the averaging operation comprises a temporal smoothing operation such that when the maximum-threshold-value is decreased, the audio processor is automatically modified to decrease an expected amplifier power consumption in order to extend a battery life of the battery.

* * * * *